United States Patent
Bevan et al.

(10) Patent No.: US 9,177,806 B2
(45) Date of Patent: *Nov. 3, 2015

(54) SYSTEM AND METHOD FOR MITIGATING OXIDE GROWTH IN A GATE DIELECTRIC

(75) Inventors: Malcolm J. Bevan, Dallas, TX (US); Haowen Bu, Plano, TX (US); Hiroaki Niimi, Tokyo (JP); Husam N. Alshareef, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/017,828

(22) Filed: Jan. 31, 2011

(65) Prior Publication Data

US 2011/0120374 A1    May 26, 2011

Related U.S. Application Data

(60) Continuation of application No. 11/931,529, filed on Oct. 31, 2007, which is a continuation-in-part of application No. 11/145,674, filed on Jun. 6, 2005, now abandoned, which is a division of application No. 10/436,848, filed on May 13, 2003, now Pat. No. 6,921,703.

(51) Int. Cl.

| | |
|---|---|
| *H01J 37/00* | (2006.01) |
| *H01L 21/00* | (2006.01) |
| *H01L 21/28* | (2006.01) |
| *H01L 21/316* | (2006.01) |
| *H01L 21/318* | (2006.01) |
| *H01L 29/51* | (2006.01) |
| *H01L 29/78* | (2006.01) |
| *H01L 29/49* | (2006.01) |

(52) U.S. Cl.
CPC .... *H01L 21/28167* (2013.01); *H01L 21/28194* (2013.01); *H01L 21/28202* (2013.01); *H01L 21/318* (2013.01); *H01L 21/31604* (2013.01); *H01L 29/513* (2013.01); *H01L 29/517* (2013.01); *H01L 29/518* (2013.01); *H01L 29/78* (2013.01); *H01L 29/4908* (2013.01)

(58) Field of Classification Search
CPC ..... H01L 21/02252; H01L 21/00; H01J 37/00
See application file for complete search history.

(56) References Cited

U.S. PATENT DOCUMENTS

| | | | |
|---|---|---|---|
| 5,292,393 A * | 3/1994 | Maydan et al. | .......... 156/345.32 |
| 5,478,780 A | 12/1995 | Koerner et al. | |
| 6,191,052 B1 | 2/2001 | Wang | |
| 6,350,321 B1 * | 2/2002 | Chan et al. | .................... 118/719 |
| 2002/0098627 A1 | 7/2002 | Pomarede et al. | |
| 2003/0041803 A1 * | 3/2003 | Kunitomo et al. | ............ 118/715 |
| 2003/0140852 A1 | 7/2003 | Schatzeder et al. | |

* cited by examiner

*Primary Examiner* — Mohammad Choudhry
(74) *Attorney, Agent, or Firm* — Jacqueline J. Garner; Frank D. Cimino

(57) ABSTRACT

Oxide growth of a gate dielectric layer that occurs between processes used in the fabrication of a gate dielectric structure can be reduced. The reduction in oxide growth can be achieved by maintaining the gate dielectric layer in an ambient effective to mitigate oxide growth of the gate dielectric layer between at least two sequential process steps used in the fabrication the gate dielectric structure. Maintaining the gate dielectric layer in an ambient effective to mitigate oxide growth also improves the uniformity of nitrogen implanted in the gate dielectric.

12 Claims, 5 Drawing Sheets

SYSTEM AND METHOD FOR MITIGATING OXIDE GROWTH IN A GATE DIELECTRIC

This application is a continuation of Ser. No. 11/931,529, filed Oct. 31, 2007 (pending), which is a continuation of Ser. No. 11/145,674 filed Jun. 6, 2005 (expired), which is a divisional of application Ser. No. 10/436,848, filed May 13, 2003, now U.S. Pat. No. 6,921,703.

TECHNICAL FIELD

The present invention relates to processes for the manufacture of semiconductor devices and, more particularly, to the formation of a gate dielectric with a gate electrode.

BACKGROUND OF THE INVENTION

In complementary metal oxide silicon (CMOS) technology, a need to enhance the speed and increase the density of CMOS integrated circuits (IC's) has resulted in the evolution of transistor scaling, accompanied by progressively thinner gate dielectric oxide. Reduction in the thickness of a gate dielectric provides increased drive current, with resultant increased speed. In addition, a thinner gate dielectric offers enhanced control of channel charge, thereby reducing short channel effects. The fabrication of thinner gate oxides, however, presents gate leakage current and reliability issues. In particular, physically thinner gate oxides exhibit gate leakage current increasing exponentially with reduction in thickness.

The leakage current can be mitigated by introducing nitrogen atoms into the gate dielectric. One method of nitrogen atom introduction is to perform non-thermal nitridation (e.g., plasma nitridation) on the gate dielectric. Nitridation, however, introduces damage (e.g., plasma damage) to the top surface of the gate dielectric that can extend into the bulk of the film and result in nitrogen pile up at lower interface for thinner films. The damage can cause high gate leakage, threshold voltage shifts, or premature oxide breakdown when the devices are operating, as well as mobility and performance reduction. A post-nitridation high temperature (e.g., at or above 900° C.) re-oxidation (HT ReOx) can be performed on the gate dielectric to mitigate the plasma damage and improve GOI.

Exposure to air and airborne molecular contaminants, such as moisture and organics, following nitridation and/or re-oxidation of the gate dielectric can result in inadvertent oxide growth of the gate dielectric, which can increase the equivalent oxide thickness (EOT) of the gate dielectric. By way of example, a nitrided gate dielectric with an equivalent oxide thickness (EOT) of about 12-13 Å and containing about 6-8% nitrogen can be formed from a starting oxide film with a thickness of about 7-8 Å. Reducing the thickness of the starting oxide film below 7-8 Å to reduce the EOT of a nitrided gate dielectric is not practical. An oxide film with a thickness of about 7-8 Å includes about two monolayers of gate oxide atoms. A further reduction in the thickness of an oxide film would result in a monolayer (i.e., about 4 Å) oxide film. Single monolayer oxide films have increased roughness compared to dual monolayer oxide films. Roughness in the starting oxide film can degrade the performance of the nitrided gate dielectric. Another detrimental effect of inadvertent exposure to air and airborne molecular contaminants is increased and variable oxide growth across wafers and from wafer to wafer. This results in higher EOT (e.g., from AMC) for the first few wafers processed, especially as EOT is reduced below about 20 Å.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to a method of reducing oxide growth of a gate dielectric layer during formation of a gate dielectric structure. An added advantage of the method is improved N-incorporation uniformity. The gate dielectric structure can be fabricated by forming a gate dielectric on a substrate, nitridating the gate dielectric, re-oxidizing or densifying the nitrided gate dielectric, and forming a conductive layer overlying the re-oxidized or densified nitrided gate dielectric. The reduction in oxide growth can be achieved by maintaining the gate dielectric in an ambient effective to mitigate oxide growth of the gate dielectric between at least two sequential process steps used in fabricating the gate dielectric structure.

An ambient effective to mitigate oxide growth can include an inert atmosphere, such as an inert gas, that can be maintained at a pressure substantially below about 760 Torr but above vacuum (e.g., about 3 Torr to about 200 Torr). The ambient can be actively purged with an inert gas (e.g., $N_2$). Maintaining the pressure of the inert atmosphere substantially below about 760 Torr but above vacuum, while actively purging the inert atmosphere with an inert gas, minimizes moisture and airborne molecular contaminants (AMCs) in the ambient, which can be absorbed by the gate dielectric. A main source of these contaminants can be incoming wafers and wafer carriers and their desorption. Moisture and AMCs in the ambient can be effectively reduced by maintaining the transfer pressure as high as possible with active purging. This high transfer pressure, however, is offset by the need to raise and lower the pressure between each process performed in the fabrication of the gate dielectric structure. Reducing the oxide growth in the gate dielectric between processes results in the formation of a gate dielectric with a substantially lower EOT and substantially higher nitrogen content, compared to the EOT and nitrogen content of a gate dielectric, which is formed without being maintained in an environment effective to mitigate oxide growth between process steps. Additionally, N uniformity is improved through the thickness of the gate dielectric layer as well as across the wafer and from wafer to wafer on which the gate dielectric structure can be formed.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates generally to a method of reducing oxide growth of a gate dielectric during formation of a gate dielectric structure. The reduction in oxide growth can be achieved by maintaining the gate dielectric in an ambient effective to mitigate oxide growth of the gate dielectric between at least two sequential process steps used to form the gate dielectric structure. An ambient effective to mitigate oxide growth can include an inert atmosphere that can be maintained at a pressure substantially below about 760 Torr but above vacuum (e.g., about 3 Torr to about 200 Torr). The ambient can also be actively purged with an inert gas (e.g., $N_2$). In one aspect, a pressure of about 10 Torr to about 100 Torr (e.g., 30 Torr) can be optimum to minimize moisture and AMCs without excessively increasing the time to raise/lower the pressure to transfer the gate dielectric structure. Maintaining the pressure substantially below about 760 Torr but above vacuum, while actively purging the ambient with an inert gas mitigates oxide growth of the gate dielectric between gate formation processes. This results in the formation of a gate dielectric with a substantially lower EOT and a substantially higher and more uniform nitrogen content compared to the EOT and nitrogen content of a gate dielectric, which is formed without being maintained in an environment effective to mitigate oxide growth between process steps.

Figure 1:
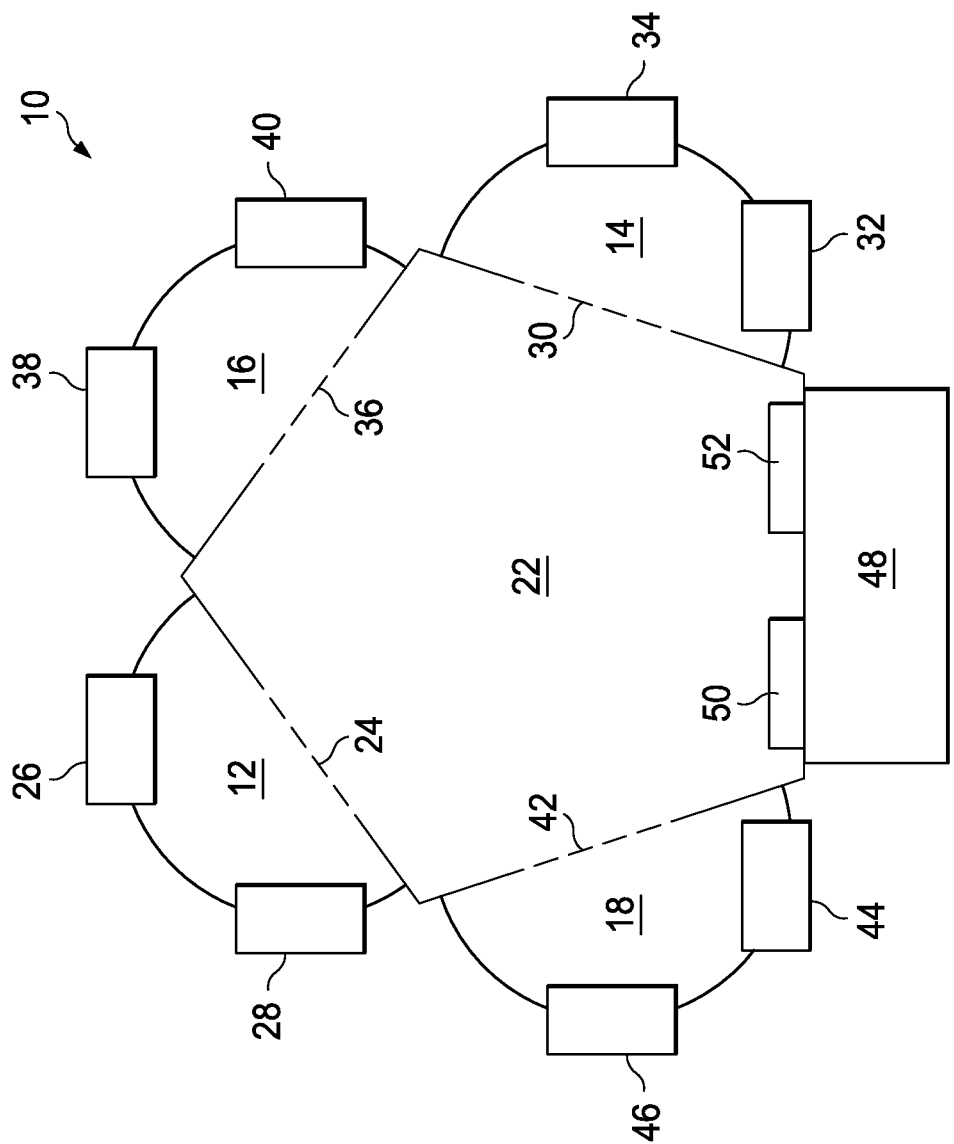
FIG. 1 is an example of a system that can be utilized to form at least part of gate dielectric structure in accordance with an aspect of the present invention.

FIG. 1 illustrates an example of a system 10 operative to form at least a portion of a gate dielectric structure in accordance with an aspect of the invention. The system 10 in this example includes four process chambers 12, 14, 16, and 18 for performing separate processes that are used in the formation of at least part of a gate dielectric structure on a substrate, such as silicon. The four process chambers 12, 14, 16, and 18 are coupled to a transfer chamber 22 that facilitates transfer of the substrate between the separate process chambers during fabrication of the gate dielectric structure. The four process chambers 12, 14, 16, and 18 and transfer chamber 22 can be maintained leak-tight during fabrication, such that, for example, less than about 1 mTorr/min of gas can leak back into each process chamber 12, 14, 16, and 18 and the transfer chamber 22 during fabrication. Transfer chamber 22 can be maintained at a fixed pressure of about 3 to about 200 Torr (e.g., about 30 Torr) and process chambers 12, 14, 16, 18 can be pumped down or back filled to this pressure to transfer the wafer, on which the gate dielectric structure is formed, in or out of the process chambers 12, 14, 16, 18.

The first process chamber 12 can be used in the formation of a gate dielectric layer (e.g., silicon dioxide ($SiO_2$) layer) over the substrate. The gate dielectric layer can have a thickness of about 7 Å to about 20 Å, and be formed by a wet and/or dry thermal oxidation processing, such as in-situ steam generation (ISSG) and low-pressure (reduced pressure) rapid thermal process (LP-RTP). It is to be appreciated that alternate methodologies can be employed to form the gate dielectric layer. For example, any suitable technique (e.g., plasma enhanced chemical vapor deposition (CVD), thermal enhanced CVD and spin on techniques) may be employed in forming the gate dielectric layer. Examples of CVD processes that may be utilized in accordance with an aspect of the present invention, include low pressure CVD (LPCVD), plasma enhanced CVD (PECVD), and rapid thermal CVD (RTCVD). It is to be appreciated, that other types of thin film formation can be employed, such as other deposition techniques (e.g., physical vapor deposition (PVD)) and film growth techniques.

Alternate materials can be employed to provide the gate dielectric material. The gate dielectric material can be $SiO_2$ or another suitable oxide material that can perform the operation associated with the gate dielectric material. Examples of some other materials that can be utilized as the gate dielectric layer include $AlO_3$, $ZrO_2$, $HfO_2$ (AlHf) $O_X$, $HfO_2$, $La_2O_3$ and $Y_2O_3$ to name a few. Those skilled in the art will understand and appreciate appropriate types of deposition techniques that can be employed to grow suitable crystalline structures to form gate dielectric layers, such as those identified above. It is to be further understood and appreciated that other materials also could be employed to form the gate dielectric layer.

The first process chamber can include a vacuum-lock door 24, which interconnects the process chamber 12 and the transfer chamber 22. Temperature within first process chamber 12 can be maintained by one or more heating elements 26 operative to heat the contents of the chamber 12 to within a desired temperature range. For example, prior to formation of the gate dielectric layer, the temperature can be maintained at about 500° C. to about 700° C. and during formation of the gate dielectric layer, for example by ISSG process, the temperature can be maintained at about 850° C. to about 1050° C. Pressure within the first process chamber 12 can be maintained by one or more pumping elements 28 operative to evacuate gas from the chamber to within a desired pressure range. For example, during formation of the gate dielectric layer (e.g., by ISSG), the pressure can be maintained at about 1 to about 20 Torr.

The second process chamber 14 can be used for the introduction of nitrogen into the gate dielectric layer by a plasma nitridation or plasma nitrided oxide process. The plasma nitridation process can include applying nitrogen-source gas, such as $N_2$, $N_2O$, NO, and $NH_3$ or a mixture of a nitrogen-source gas and inert gases, such as He, Ne, Ar, Kr, Xe, and mixtures thereof, to the exposed surface of the gate dielectric layer. The plasma nitridation process or nitrided oxide process introduces nitrogen atoms into the gate dielectric layer, which mitigates leakage associated with the gate device and blocks boron into the active channel.

The second process chamber 14 can include a vacuum-lock door 30 through which the substrate can be transferred between the second process chamber 30 and the transfer chamber 22. Temperature within second process chamber 14 can be maintained by one or more heating elements 32 operative to heat the contents of the chamber 14 to within a desired temperature range. Pressure within the second process chamber 14 can be maintained by one or more pumping elements 34 operative to introduce or evacuate gas from the chamber to within a desired pressure range. In one aspect of the invention, the plasma nitridation process or plasma nitrided oxide process can be performed in the second process chamber 14 for about 3 seconds to about 60 seconds at a power of about 2 watts to about 3000 watts and a pressure of about 5 mTorr to about 50 Torr.

The third process chamber 16 can be used for the re-oxidation of the nitrided gate dielectric, for example by rapid thermal oxidation (RTO), or post anneal or densification in an inert atmosphere, for example by RTP, or a combination of both. Re-oxidation or post annealing of the nitrided gate dielectric layer provides a thin dielectric layer without surface damage and with nitrogen atoms embedded therein to facilitate the mitigation of leakage through the gate dielectric and improved transistor performance, for example improved drive current, mobility etc. The third process chamber 16 can include a vacuum-lock door 36 through which the substrate can be transferred between the third process chamber 16 and the transfer chamber 22. Temperature within the third process chamber 16 can be maintained by one or more heating elements 38 operative to heat the contents of the chamber to within a desired temperature range. For example, prior to re-oxidation, the temperature can be maintained at about 500° C. to about 700° C. and during re-oxidation of the nitrided dielectric layer, for example by RTO, the temperature can be maintained at about 900° C. to about 1050° C. A post anneal in $N_2$ from about 900° C. to about 1050° C. could be applied. Pressure within the third process chamber 16 can be maintained by one or more pumping elements 40 operative to introduce or evacuate gas from the chamber 36 to within a desired pressure range. For example, during re-oxidation (e.g., RTO) of the dielectric layer the pressure can be maintained at about 0.5 Torr to about 50 Torr.

The fourth process chamber 18 can be used in the formation of a conductive layer, such as polysilicon, over the re-oxidized, nitrided gate dielectric. If the conductive layer is comprised of polysilicon, the conductive layer may be formed using any suitable technique including chemical vapor deposition (CVD) techniques, such as low pressure chemical vapor deposition (LPCVD) or plasma enhanced chemical vapor deposition (PECVD). If the conductive layer is comprised of amorphous silicon, germanium, or their combination, standard deposition techniques may be employed. If the conductive layer is comprised of a metal, standard sputtering techniques may be employed.

The fourth process chamber 18 can include a vacuum-lock door 42 which interconnects the process chamber 18 and the transfer chamber 22. Temperature within the fourth process chamber 18 can be maintained by one or more heating elements 44 operative to heat the contents of the fourth chamber 18 to within a desired temperature range. For example, during formation of the conductive layer (e.g., by CVD) the temperature can be maintained at about 500° C. to about 800° C. Pressure within the fourth process chamber 18 can be maintained by one or more pumping elements 46 operative to introduce or evacuate gas from the chamber 18 to within a desired pressure range. For example, during formation of the conductive layer (e.g., by CVD) the pressure can be maintained at about 250 Torr to about 350 Torr.

The transfer chamber 22 interconnects the process chambers 12, 14, 16, and 18 and provides an interface between the process chambers 12, 14, 16, and 18 during fabrication of at least part of the gate dielectric structure. The transfer chamber 22 can include one or more cool-down chamber (not shown) to allow cooling of the gate dielectric between fabrication processes. Load locks 48 can be provided to allow introduction and removal of a substrate from the transfer chamber 22.

The transfer chamber 22 contains an ambient, such as an inert atmosphere, which comprises an inert gas (e.g., $N_2$, He, Ar, Kr, Xe and mixtures thereof). Pressure within the transfer chamber 22 can be maintained by one or more pumping elements 50 operative to evacuate gas from the chamber to within a desired pressure range. For example, the inert atmosphere can be maintained at a pressure substantially below about 760 Torr. The inert atmosphere can also be maintained at a pressure above vacuum levels (i.e., mTorr levels). Additionally, a gas distribution system 52 can be in fluid communication with the transfer chamber 22 for actively purging the ambient of the transfer chamber 22. By "actively purging" it is meant that the inert gas can be introduced into the transfer chamber 22 at a rate effective to continuously evacuate the atmosphere of the transfer chamber 22. By way of example, a flow rate effective to continuously evacuate the atmosphere of the transfer chamber 22 can be about 2 liters per minute to about 7 liters per minute. The inert gas used for purging can include any inert gas, such as $N_2$, He, Ar, Kr and Xe, and mixtures thereof, as well as other inert gases and mixture thereof which do not detrimentally affect (e.g., oxidize) the gate dielectric during transfer.

Maintaining the pressure of the inert atmosphere of the ambient substantially below 760 Torr but above vacuum, while actively purging the ambient, can establish a uniform, laminar gas flow within the ambient. This uniform, laminar gas flow can provide sufficient drag to evacuate airborne molecular contaminants (AMCs) (e.g., moisture and organics) from the ambient. Airborne molecular contaminants can potentially be absorbed by the gate dielectric and cause oxide growth of the gate dielectric.

In one aspect, the inert atmosphere can be maintained at a pressure of about 3 Torr to about 200 Torr (e.g., 30 Torr) while being actively purged by a gas having a flow rate of about 2 liters per minute to about 7 liters per minute (e.g., 5 liters per minute). At a pressure of about 3 Torr to about 200 Torr, residual moisture and organics from the processes used to form the gate electrode structure can be readily evaporated and be evacuated from ambient by the inert gas. Residual moisture and organics can be diluted by operating at higher pressures, for example, about 10 fold as pressure is increased from about 3 to about 30 Torr. Atmosphere pressures below about 3 Torr are difficult to maintain during active purging gas and do not readily facilitate the establishment of a uniform, laminar gas flow, which has sufficient drag force to evacuate airborne molecular contaminants. Atmosphere pressures above about 200 Torr decrease the rate at which moisture and organics can be evaporated and are substantially higher than at least some of the pressures used for the processes. An optimum operating pressure can be about 10 to about 100 Torr (e.g., about 30 Torr) and can reduce levels of moisture and organics without excessively prolonging time to bring process chambers up or down to transfer chamber pressure to allow wafer transfer.

Figure 2:
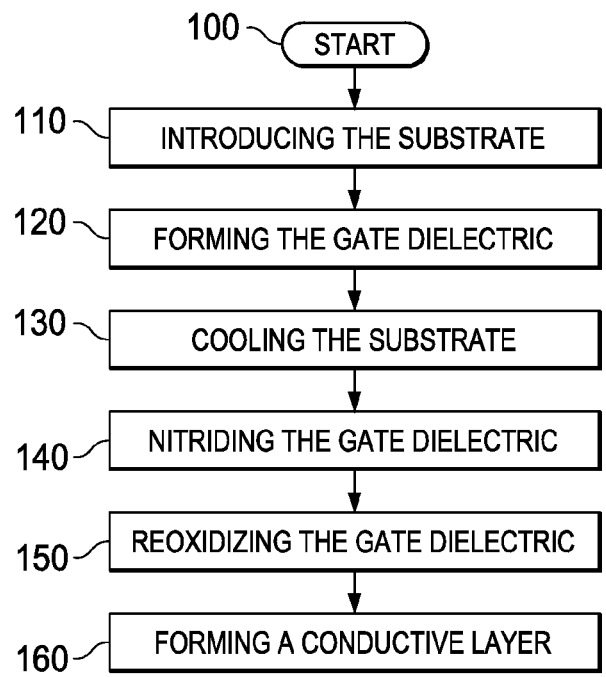
FIG. 2 is a methodology for forming at least part of the gate dielectric structure using the system of FIG. 1 in accordance with an aspect of the present invention.

FIG. 2 illustrates a methodology of fabricating a gate dielectric structure using the system described above. The methodology begins at 100 such as in connection with providing and preparing a substrate material, such as silicon. At 110, the substrate can be introduced into the system by transferring the substrate through the load lock into the transfer chamber. The transfer chamber contains an inert atmosphere, which throughout the fabrication process, can be maintained, for example, at a pressure of about 3 Torr to about 200 Torr, a temperature of about 20° C. to about 30° C., and can be actively purged with an inert gas, such as $N_2$, at a flow rate of about 2 liters per minute to about 7 liters per minute.

The substrate can be transferred from the transfer chamber into the first process chamber, which can be evacuated, for example, to a pressure of about 1 Torr to about 20 Torr. At 120, a gate dielectric can be formed overlying the substrate. By way of example, the gate dielectric can be formed using an ISSG process at a temperature of about 850° C. to about 1050° C.

Following formation of the gate dielectric at 120 and once pressure is equalized to that of the transfer chamber, the gate dielectric can be transferred from first process chamber into the transfer chamber. At 130, the substrate can be cooled within the transfer chamber, for example, to a temperature below about 150° C.

Following cooling at 130, the substrate with the overlying gate dielectric can be transferred into the second process chamber, which is then evacuated, for example, to a pressure of about 15 Torr to about 50 mTorr. At 140, nitrogen can be introduced into an exposed surface of the gate dielectric. By way of example, the nitrogen can be introduced into the gate dielectric by plasma nitridation (PN). The nitrided gate dielectric can then be transferred from second processing chamber, through the transfer chamber, into the third process chamber.

At 150, the nitrided gate dielectric can be re-oxidized or densified to remove any plasma damage to the layer. By way of example, the re-oxidation can be performed by RTO at a temperature of about 900° C. to about 1050° C. and a pressure of about 0.5 Torr to about 50 Torr.

After re-oxidation at 150, the gate dielectric can be transferred from the third process chamber, through the transfer chamber, and into fourth process chamber. At 160, a conductive layer, such as polysilicon, can be formed over the gate dielectric and substrate. The conductive layer can be formed for example by chemical vapor deposition (CVD) at a temperature of about 600° to about 800° C. and a pressure of about 200 Torr to about 300 Torr.

Figure 3:
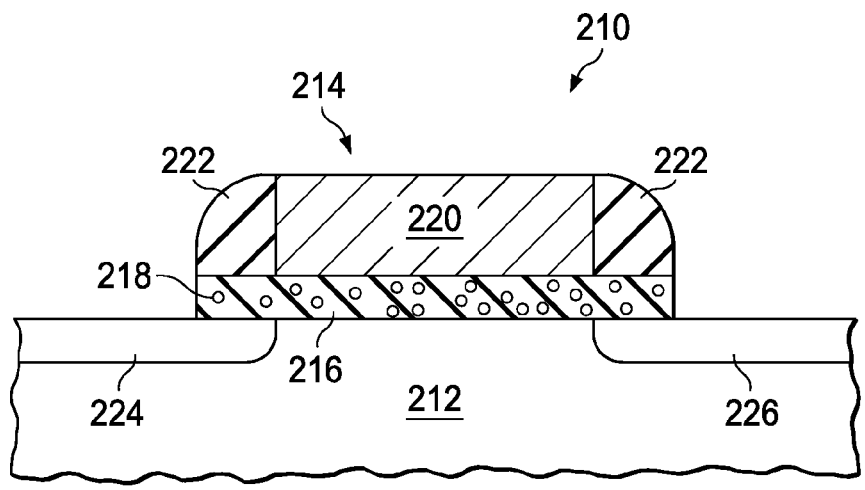
FIG. 3 is a schematic cross-sectional illustration of a gate dielectric structure in accordance with an aspect of the present invention.

FIG. 3 illustrates a transistor device 210 (e.g., MOSFET device) having a gate dielectric structure 214 in accordance with an aspect of the present invention. The transistor device 210 can be fabricated on a substrate 212, such as silicon. The transistor device 14 includes a thin gate dielectric layer 216 (e.g., about 8 Å to about 20 Å oxide layer). It is to be appreciated that the transistor device 210 is provided for illustrative purposes and that the substrate can include a plurality of transistor devices.

The gate dielectric layer 216 can be an oxide (e.g., silicon dioxide ($SiO_2$)) or any other dielectric material suitable for operating as a gate oxide of a transistor device. Since the gate dielectric layer 216 is relatively thin (i.e., less than 20 Å) nitrogen atoms 218 are introduced into the dielectric layer 216 to suppress leakage currents associated with the operation of the transistor device 210. The nitrogen atoms 218 can be introduced into the dielectric layer 216 by a plasma nitridation or plasma nitrided oxide process. The plasma nitridation, however, causes a damaged (e.g., plasma damaged) surface layer of the gate dielectric layer 216 or through the bulk of the oxide layer.

A re-oxidation or densifying process can be performed on the damaged layer to provide a gate dielectric layer 216 substantially without damage and with nitrogen atoms 218 embedded therein to facilitate the mitigation of leakage of the transistor device 210. The re-oxidation on plasma nitrided oxide removes plasma damage from plasma nitrided oxide, and minimizes nitrogen loss during a subsequent fabrication processes as well as improves MOSFET performance, for example drive current and mobility.

The transistor device 210 can also include a gate electrode 20 that can be disposed over the gate dielectric layer 216. The gate electrode 220 can be comprised of polysilicon, amorphous silicon, germanium, or metal. Sidewall spacers 222 of a suitable insulating material can be disposed adjacent to the sidewalls of the gate electrode 220. A source region 224 and a drain region 226 can also be formed in the substrate 212.

The source and drain regions 224 and 226 can also include source/drain extensions (not shown) that extend to regions generally aligned with and partially beneath the edges of the gate electrodes. Those skilled in the art will understand and appreciate that the transistor can be either a P type or N type transistor. The source and drain regions 224 and 226 can be formed as N or P type regions by doping with boron, arsenic or other appropriate doping materials, as known in the art.

Figure 4:
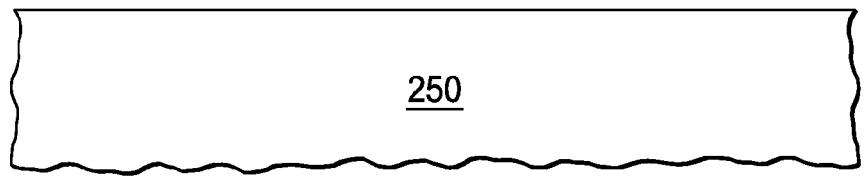
FIG. 4 illustrates a schematic cross-sectional view of a substrate in accordance with an aspect of the present invention.

FIGS. 4-9 illustrate a methodology of fabricating a part of a transistor device in accordance with an aspect of the present invention. Referring to FIG. 4, a substrate layer 250 that can be formed from a semiconductor material, such as silicon or polysilicon. The substrate layer 250, however, could be formed from any materials such as gallium arsenide, germanium, silicon-germanium, epitaxial formations, silicon carbide, indium phosphide, silicon-on-insulator substrates (SOI), strained Si substrates, and/or other semiconductor substrate materials.

Figure 5:
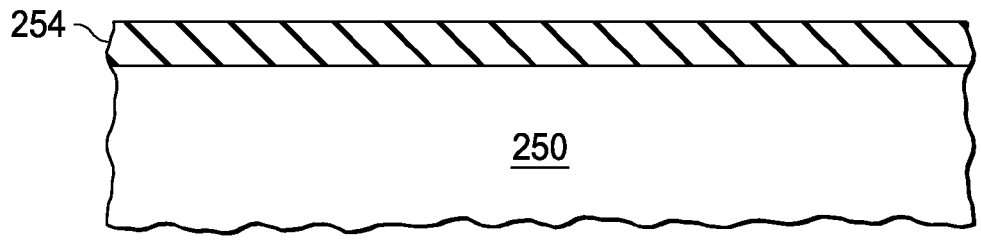
FIG. 5 illustrates a schematic cross-sectional illustration of the structure of FIG. 4 after a gate dielectric layer is formed over the substrate in accordance with an aspect of the present invention.

FIG. 5 illustrates the substrate 250 after an oxidation process is initiated to form a gate dielectric layer 254 (e.g., silicon dioxide ($SiO_2$) layer) over the substrate 250. The gate dielectric layer 254 can have a thickness of about 7 Å to about 15 Å, and be formed by a wet and/or dry thermal oxidation processing. In one aspect of the invention, the gate dielectric layer can be formed using an ISSG process in which the substrate 250 is heated to a temperature of about 850° C. to about 1050° C. in an atmosphere maintained at a pressure of about 1 Torr to about 20 Torr for about 5 to about 60 second.

Figure 6:
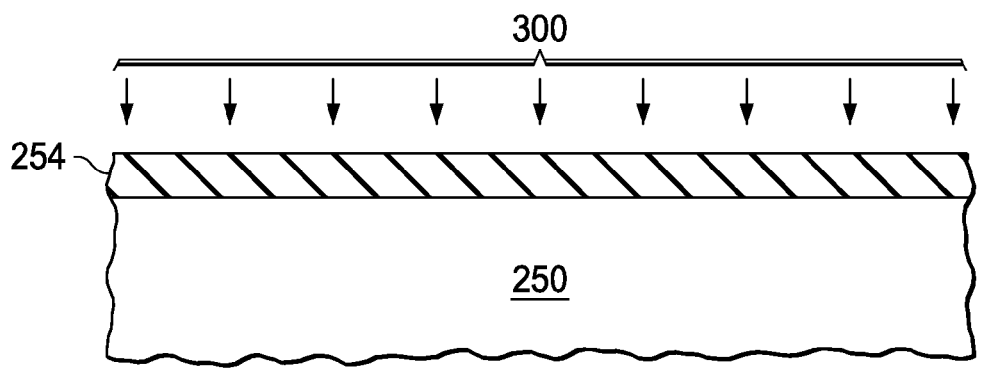
FIG. 6 illustrates a schematic cross-sectional illustration of the structure of FIG. 5 undergoing a nitridation process in accordance with an aspect of the present invention.
Figure 7:
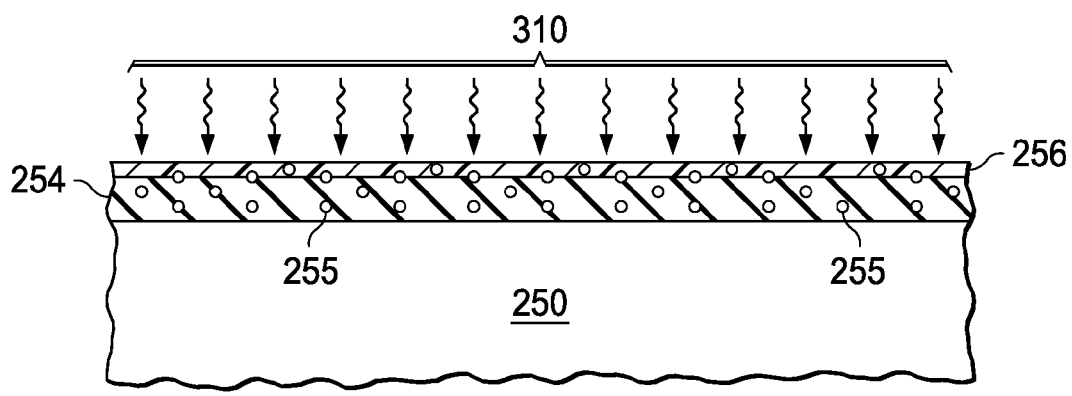
FIG. 7 illustrates a schematic cross-sectional illustration of the structure of FIG. 5 undergoing a re-oxidation process in accordance with an aspect of the present invention.
Figure 8:
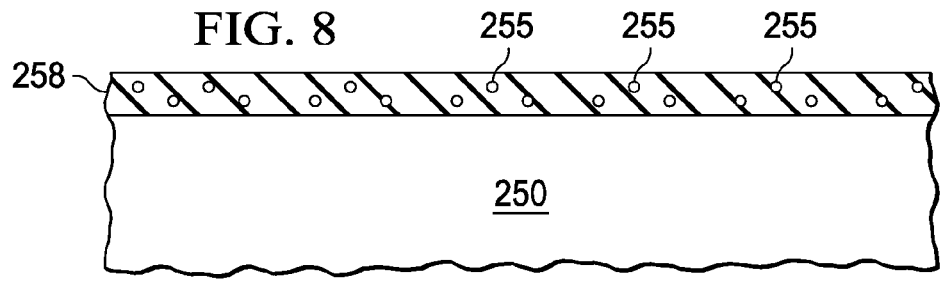
FIG. 8 illustrates a schematic cross-sectional illustration of the structure of FIG. 7 after the re-oxidation process in accordance with an aspect of the present invention.

After formation of the gate dielectric layer 254 over the substrate 250, nitrogen can be introduced into the gate dielectric layer 254. FIG. 6 illustrates the introduction of nitrogen into the gate dielectric layer 254 by a plasma nitridation or plasma nitrided oxide process 300. The plasma nitridation process or nitrided oxide process 300 introduces nitrogen atoms 255 (FIG. 7) into the gate dielectric layer 254, which mitigates leakage associated with the gate device. In one aspect of the invention, the plasma nitridation process or plasma nitrided oxide process can be performed for about 3 seconds to about 60 seconds at a power of about 2 watts to about 3000 watts and a pressure of about 5 mTorr to about 50 Torr. The plasma nitridation may also cause plasma damage to the layer 256 (FIG. 7). The plasma damage to the layer 256 can cause high gate leakage, threshold voltage shifts, or premature oxide breakdown when the devices are operating.

Following introduction of nitrogen into the gate dielectric layer 254, the gate dielectric layer can be re-oxidized or densified, for example by rapid thermal oxidation (RTO). FIG. 7 illustrates a re-oxidation process 310 being performed on the damaged surface layer 256 to provide a thin dielectric layer 258 without plasma damage (FIG. 8) and with nitrogen atoms 255 embedded therein to facilitate the mitigation of leakage of the transistor device. By way of example, the re-oxidation 310 on plasma nitrided dielectric layer 256 can be performed at a temperature of about 400° C. to about 1200°

C. for about 1 to about 60 seconds, at a pressure of about 1 to about 50 Torr with a gas having about 1% to about 100% of an oxygen-source, such as $O_2$, $N_2O$, and NO in an inert gas, such as He, Ne, Ar, Kr, Xe and $N_2$. The re-oxidation process 310 can be performed in a rapid thermal processing (RTP) chamber or an oxidation furnace.

Figure 9:
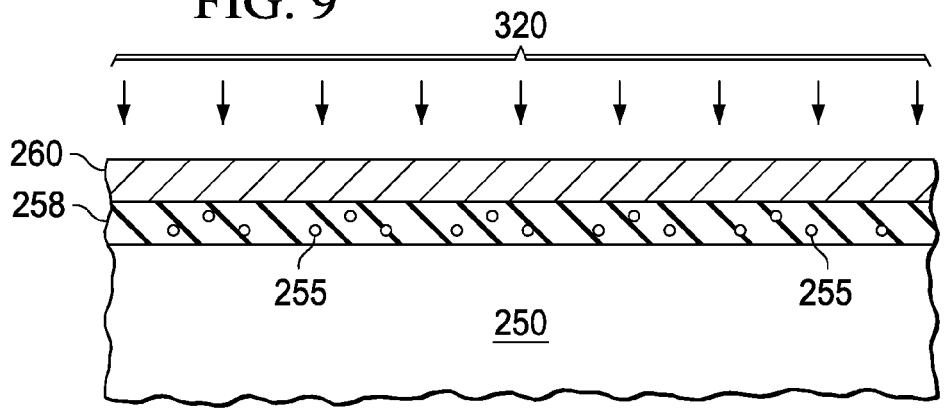
FIG. 9 illustrates a schematic cross-sectional illustration of the structure of FIG. 8 after undergoing a conductive layer deposition process in accordance with an aspect of the present invention.

After re-oxidation of the nitrided gate dielectric, a conductive layer 260 can deposited (e.g., by chemical vapor deposition (CVD) techniques) over the resultant structure to provide the conductive gate electrode of the gate structure. FIG. 9 illustrates the gate structure after the conductive layer is deposited over the resultant structure.

During transfer of the gate dielectric between processes used in the formation of the gate electrode structure (e.g., between the initial oxidation process and the nitridation process, between the nitridation process and the re-oxidation process, and/or between the re-oxidation process and the deposition process), the gate dielectric can be maintained in an ambient, such as an inert atmosphere that includes an inert gas (e.g., $N_2$, He, Ar, Kr, Xe, and mixtures thereof). The inert atmosphere can be maintained at a pressure substantially below about 760 Torr. The inert atmosphere can also be maintained at a pressure above vacuum levels (i.e., mTorr levels). The ambient can be actively purged with an inert gas. In one aspect, the inert atmosphere can be maintained at a pressure of about 3 Torr to about 200 Torr (e.g., 30 Torr) while being actively purged by a gas with a flow rate of about 2 liters per minute to about 7 liters per minute (e.g., 5 liters per minute).

Maintaining the pressure of the inert atmosphere of the ambient substantially below about 760 Torr but above vacuum, while actively purging the ambient, mitigates oxide growth of the gate dielectric during transfer of the gate dielectric between processes. Reducing the oxide growth of gate dielectric between processes results in the formation of a gate dielectric with a substantially lower EOT, improved uniformity, and substantially higher nitrogen content compared to the EOT and nitrogen content of a gate dielectric, which is formed without being maintained in an environment effective to minimize oxide growth between processes.

Figure 10:
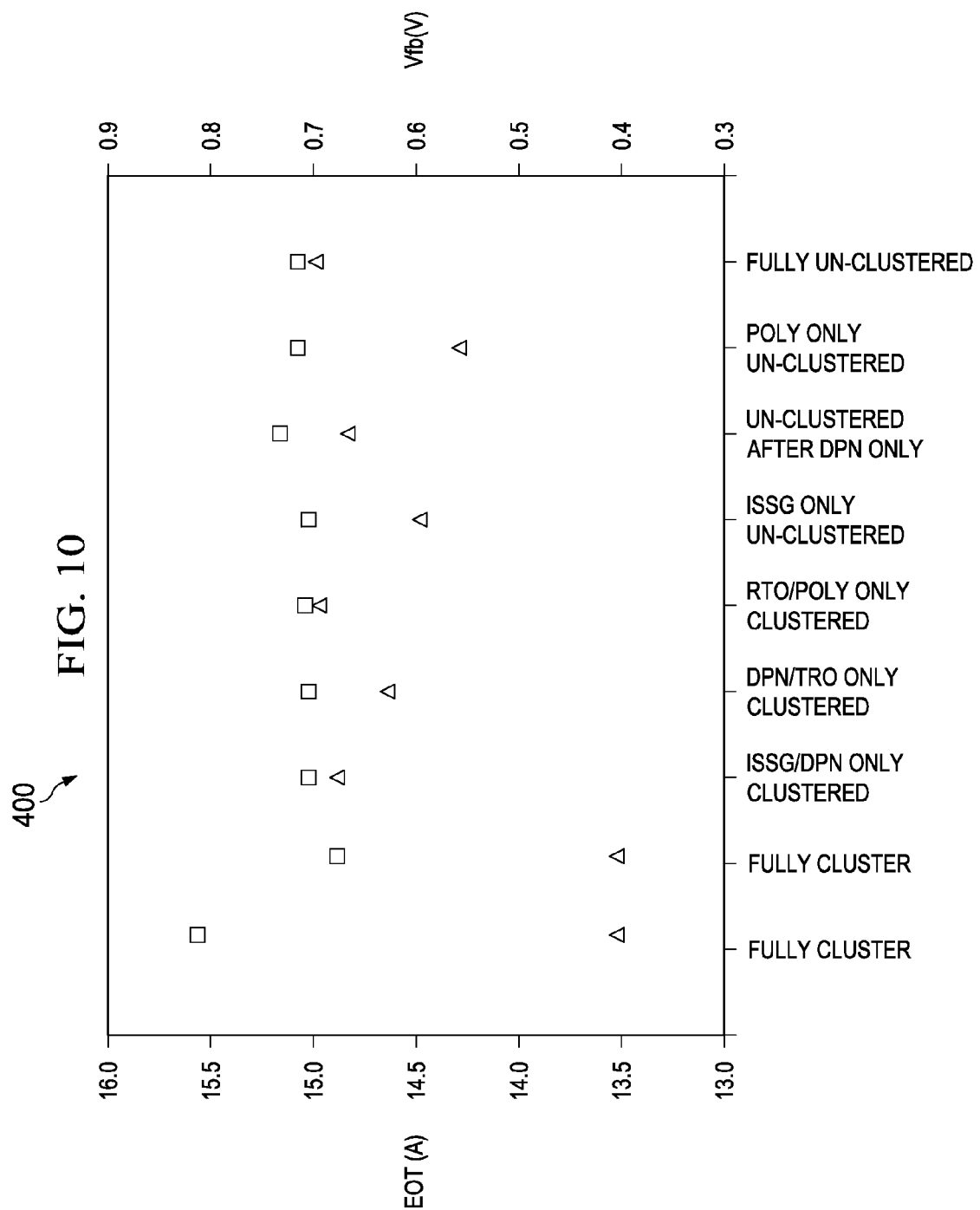
FIG. 10 illustrates a graph of the equivalent oxide thickness and flat band voltage of the dielectric layer for different methods associated with the fabrication of the gate dielectric layer.

FIG. 10 illustrates a graph 400 comparing the equivalent oxide thickness (Å) (represented by triangles) and flat band voltage (Vfb) (represented by squares) of gate dielectric layers fabricated by different methods. For each fabrication method, the equivalent oxide thickness and flat band voltage were measured after an in-situ steam generation process (ISSG), a plasma nitridation process (PN), a re-oxidation process (RTO), and a polysilicon deposition process (POLY) have been performed on a silicon substrate. The fabrication methods differed in that between processes of some methods the gate dielectric electric was maintained in ambient effective to mitigate oxide growth (e.g., an inert atmosphere maintained at 30 Torr and actively purged with an inert gas at a flow rate of about 5 liters per minute), as opposed to being exposed to an air atmosphere. Processes, which are referred to in the graph as being "clustered", are processes between which the gate dielectric layer was maintained in ambient effect to mitigate oxide growth. Processes, which are referred to in the graph as being "un-clustered", are processes between which the gate dielectric layer was exposed to an air atmosphere.

As illustrated in the graph 400, fabrication methods that include at least two processes that were clustered formed dielectric layers with substantially lower equivalent oxide thicknesses than the fabrication method that did not include any clustering. For example, fabrication methods in which the ISSG, DPN, RTO, and POLY were all clustered showed an about 12% to about 13% equivalent oxide improvement (i.e., about 1.1 to about 1.5 reduction in equivalent oxide thickness) compared to the fabrication method which was un-clustered. Even in fabrication methods where only two process were clustered (e.g., ISSG and DPN, DPN and RTO, and RTO and POLY), an improvement in equivalent oxide thickness was observed compared to fabrication methods in which the processes were un-clustered. This improvement in EOT was achieved without a decrease in flat band voltage.

Figure 11:
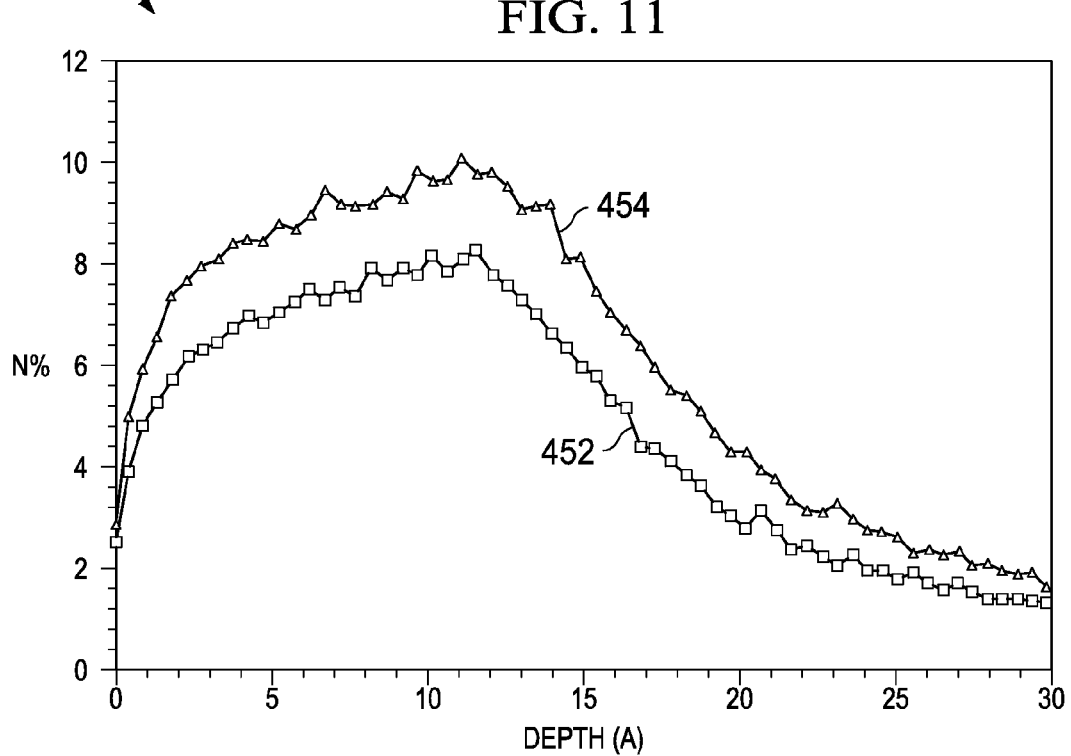
FIG. 11 illustrates a graph of nitrogen concentration versus gate dielectric depth of the thick gate dielectric layer for different processes associated with fabricating the gate dielectric layer.

FIG. 11 illustrates a graph 450 of nitrogen concentration versus gate dielectric depth of a thick gate dielectric layer (e.g., plasma nitrided 10 Å oxide layer) for different processes associated with fabrication of a gate dielectric. The nitrogen concentration was measured using a commercially available Time of Flight-Secondary Ion Mass Spectrometer (TOF-SIMS). A first indicator 452 references data points (represented by squares) associated with nitrogen concentration in a dielectric layer versus depth after an in-situ steam generation process, a plasma nitrided process, and a re-oxidation process has been performed on a silicon substrate. Between each of these processes, the gate dielectric layer is exposed to air. A second indicator 454 references data points (represented by triangles) associated with nitrogen concentration in a dielectric layer versus depth after an in-situ steam generation process, a plasma nitrided process, and a re-oxidation process has been form on a silicon substrate. Between each process, the gate dielectric layer was maintained in ambient effective to mitigate oxide growth (e.g., an inert atmosphere maintained at 30 Torr and actively purged in an inert gas at a flow rate of about 5 liters per minute).

As illustrated in the graph 450, substantially more nitrogen (i.e., about 30% more N) was incorporated in the gate dielectric layer when the gate dielectric layer was maintained in an ambient effective to mitigate growth between processes compared to air. This increase in nitrogen enhances the dielectric quality (e.g., mitigates leakage) of the dielectric layer. In comparison to a gate dielectric with same level of nitrogen that is formed using an un-clustered process, a gate dielectric layer formed using a clustered process showed improved performance at a reduced EOT. In addition, for oxide films about 10 Å to about 20 Å, graphs similar to 450 show flatter N profiles (with improved dielectric reliability) and improved N uniformity across the wafer and from wafer to wafer.

Those skilled in the art will appreciate and understand that although the gate dielectric in the system and methodology described above is maintained in an ambient effective to mitigate oxide growth during transfer of the gate dielectric between the four fabrication processes, the gate dielectric could be maintained in the ambient between just two sequential processes. Additionally, although the dielectric in the system and methodology described above is transferred through the same transfer chamber between fabrication processes, the gate dielectric could potentially be transferred through separate transfer chambers between sequential processes. At least one of the separate transfer chambers could include an ambient effective to mitigate oxide growth of the gate dielectric.

Those skilled in the art will also understand and appreciate that various processing operations that can be utilized in formation of transistors in accordance with an aspect of the present invention. By way of example, the gate electrodes can be patterned via photolithography and etched (e.g., via an etch chemistry or plasma etching) to form the gate electrode structures. Ion implantation or other doping techniques can be utilized to form source/drain regions 224 and 226 (FIG. 3). It further is to be appreciated that the gate electrode structures can be used in the formation of CMOS, BiCMOS or HBT devices.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A processing system for use in forming at least part of a gate dielectric structure on a substrate, comprising:
    a first process chamber for forming a gate dielectric layer over the substrate, the first process chamber having a first pumping element configured to evacuate gas from the first process chamber;
    a second process chamber for introducing nitrogen atoms in the gate dielectric layer, the second process chamber having a second pumping element configured to evacuate gas from the second process chamber;
    a transfer chamber connected to the first process chamber via a first vacuum lock door and connected the second process chamber via a second vacuum lock door, the transfer chamber having a gas distribution system and a third, distinct pumping element configured to provide an ambient of uniform, laminar inert gas flow within the transfer chamber during transfer of the substrate between the first process chamber and the second process chamber; and
    a load lock distinct from said transfer chamber to allow introduction and removal of the substrate from the processing system.

2. The processing system of claim 1, wherein the gas distribution system and third distinct pumping element are configured to maintain a pressure substantially below about 760 Torr in the transfer chamber and actively purge the transfer chamber with an inert gas during said transfer.

3. The processing system of claim 2, wherein the gas distribution system and third distinct pumping element are configured to maintain the atmosphere at a pressure of about 3 Torr to about 200 Torr in the transfer chamber during said transfer.

4. The processing system of claim 3, wherein the gas distribution system and third distinct pumping element are configured to actively purge the transfer chamber at a flow rate of about 2 liters per minute to about 5 liters per minute during said transfer.

5. The processing system of claim 4, further comprising a third processing chamber for performing a re-oxidation or densifying process, the third processing chamber connected to the transfer chamber via a third vacuum lock door.

6. The processing system of claim 5, further comprising a fourth process chamber for forming a conductive layer over the re⁻-oxidized or densified gate dielectric layer, the fourth process chamber connected to the transfer chamber via a fourth vacuum lock door.

7. A processing system for forming a gate stack of a transistor, comprising:
    a transfer chamber connected to a first process chamber for forming a gate dielectric layer over a substrate, a second process chamber for introducing nitrogen atoms in the gate dielectric layer, and a load lock, the transfer chamber configured to transfer the substrate from the first process chamber to the second process chamber; and
    a gas distribution system in fluid communication with the transfer chamber and one or more pumping elements connected to the transfer chamber, the gas distribution system and one or more pumping elements configured to provide an ambient of uniform, laminar inert gas flow within the transfer chamber during transfer of the substrate between the first process chamber and the second process chamber.

8. The processing system of claim 7, wherein the gas distribution system and one or more pumping elements are configured to maintain a pressure substantially below about 760 Torr in the transfer chamber and actively purge the transfer chamber with an inert gas during said transfer.

9. The processing system of claim 8, wherein the gas distribution system and one or more pumping elements are configured to maintain the atmosphere at a pressure of about 3 Torr to about 200 Torr in the transfer chamber during said transfer.

10. The processing system of claim 9, wherein the gas distribution system and one or more pumping elements are configured to actively purge the transfer chamber at a flow rate of about 2 liters per minute to about 5 liters per minute during said transfer.

11. The processing system of claim 10, further comprising a third processing chamber for performing a re-oxidation or densifying process, the third processing chamber connected to the transfer chamber.

12. The processing system of claim 11, further comprising a fourth process chamber for forming a conductive layer over the re⁻-oxidized or densified gate dielectric layer, the fourth process chamber connected to the transfer chamber.

* * * * *